United States Patent
Dujari et al.

(10) Patent No.: US 6,359,372 B1
(45) Date of Patent: Mar. 19, 2002

(54) CIRCUIT CARD ASSEMBLY HAVING CONTROLLED EXPANSION PROPERTIES

(75) Inventors: Prateek Dujari, Portland; Terrance J. Dishongh; Bin Lian, both of Hillsboro; Damion T. Searls, Portland, all of OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/564,144

(22) Filed: May 3, 2000

(51) Int. Cl.$^7$ .............................................. H01L 41/08
(52) U.S. Cl. ...................................... 310/328; 310/317
(58) Field of Search ........................ 310/328, 330–332, 310/340, 314, 317, 316.01

(56) References Cited

U.S. PATENT DOCUMENTS

| | | | |
|---|---|---|---|
| 4,711,804 A | 12/1987 | Burgess | 428/210 |
| 4,806,859 A | 2/1989 | Hetrick | 324/207 |
| 4,849,668 A | 7/1989 | Crawley et al. | 310/328 |
| 4,980,699 A | * 12/1990 | Tanabe et al. | 346/1.1 |
| 5,251,863 A | 10/1993 | Gossman et al. | 248/550 |
| 5,387,834 A | * 2/1995 | Suzuki | 310/317 |
| 5,424,596 A | * 6/1995 | Mendenhall et al. | 310/328 |
| 5,458,222 A | 10/1995 | Pla et al. | 188/378 |
| 5,525,853 A | 6/1996 | Nye et al. | 310/316 |
| 5,650,685 A | 7/1997 | Kosinksi et al. | 310/316 |
| 5,821,666 A | 10/1998 | Matsumoto et al. | 310/316 |
| 5,996,418 A | 12/1999 | Rector et al. | 73/702 |
| 6,069,433 A | * 5/2000 | Lazarus et al. | 310/328 |
| 6,102,426 A | 8/2000 | Lazarus et al. | 280/602 |
| 6,147,434 A | * 11/2000 | Nakano et al. | 310/317 |
| 6,191,519 B1 | 2/2001 | Nye et al. | 310/316.01 |
| 6,252,334 B1 | 6/2001 | Nye et al. | 310/328 |

FOREIGN PATENT DOCUMENTS

| | | | |
|---|---|---|---|
| EP | 0806589 | 11/1997 | F16F/15/02 |
| GB | 2324434 | 10/1969 | G10K/11/178 |
| JP | 01-135656 | 5/1989 | B41J/3/10 |
| JP | 02-166403 | 6/1990 | G02B/5/10 |
| JP | 04-208584 | 7/1992 | H01S/3/139 |
| JP | 06-021588 | 1/1994 | H05K/1/02 |

OTHER PUBLICATIONS

Sealing, C., et al., "Accelerated Stress Testing and Health Monitoring of Laminated Circuit Card Assemblies Using Piezoelectric Actuators and Sensors", Proceedings of the 13th Annual Technical Conference on Composite Materials, 11 pgs., (Sep. 21–23, 1998).

* cited by examiner

*Primary Examiner*—Mark O. Budd
(74) *Attorney, Agent, or Firm*—Schwegman, Lundberg, Woessner & Kluth, P.A.

(57) ABSTRACT

Piezoelectric material is embedded in epoxy layers of circuit cards to control thermal expansion and contraction as a function of temperature changes. A temperature sensor and thermostat generates a controlled voltage as a function of temperature and applies the voltage to piezoelectric blocks within the circuit card. Local areas of the circuit card can have different amounts of piezoelectric material or different thermostats. Piezoelectric blocks can be arranged in regular patterns or can be randomly or pseudo-randomly placed.

17 Claims, 1 Drawing Sheet

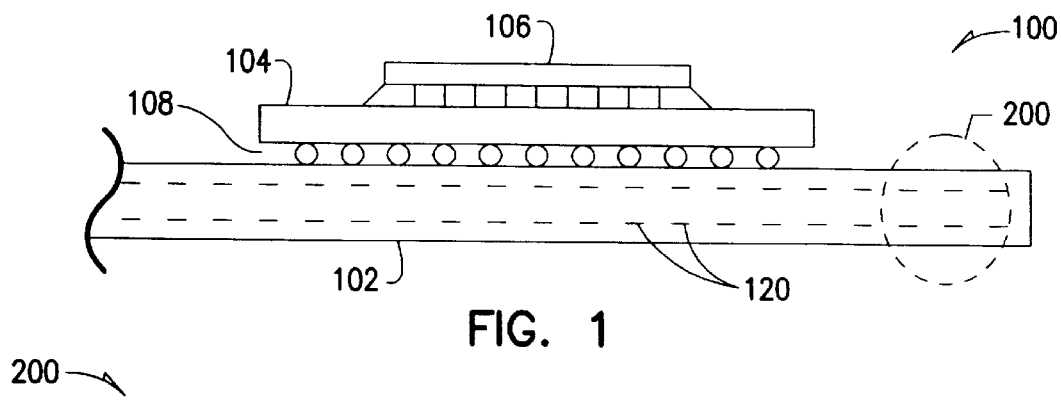
FIG. 1
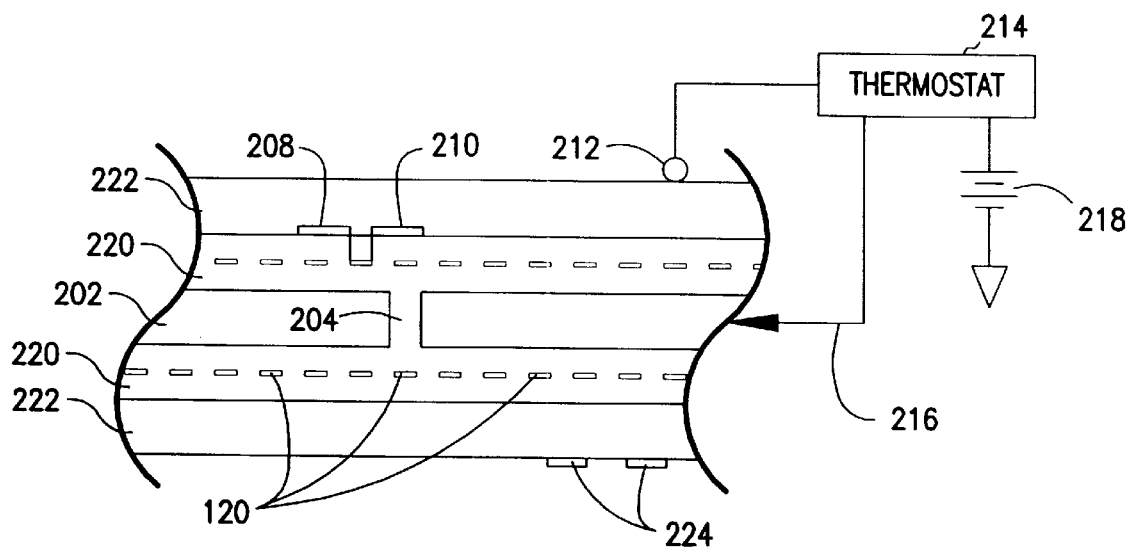
FIG. 2
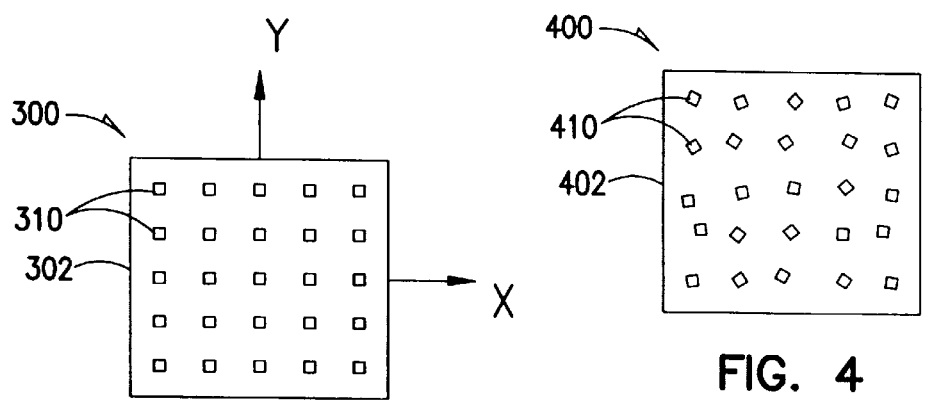
FIG. 3
FIG. 4

CIRCUIT CARD ASSEMBLY HAVING CONTROLLED EXPANSION PROPERTIES

FIELD

The present invention relates generally to printed circuit cards, and more specifically to printed circuit card assemblies having controlled expansion properties.

BACKGROUND OF THE INVENTION

Rapid advances in technology and increasing consumer demand are driving manufacturers and suppliers of electronics systems to increase the density of circuit cards, and to populate the circuit cards with larger and larger circuit devices. Typical modem circuit cards are densely populated with large and complex integrated circuits, such as microprocessors and supporting chipsets.

As circuit devices such as microprocessors increase in size, the likelihood of solder joint failure increases due to a mismatch in coefficients of thermal expansion between devices and cards. For example, if a large microprocessor is surface mounted to a circuit card, solder connections exist across the width and length of the microprocessor. If the microprocessor has a coefficient of thermal expansion different from the coefficient of thermal expansion of the circuit card to which it is mounted, the microprocessor package and the circuit card expand and contract different amounts as a function of temperature. As a result, interconnect failures can result at solder joints.

For the reasons stated above, and for other reasons stated below which will become apparent to those skilled in the art upon reading and understanding the present specification, there is a need in the art for a method and apparatus to control thermal expansion properties of circuit card assemblies.

BRIEF DESCRIPTION OF THE DRAWINGS

FIG. 1 shows a cross section of a circuit card assembly;

FIG. 2 shows a cross section of a circuit card;

FIG. 3 is a top view of a circuit card layer having piezoelectric blocks arranged in a regular pattern; and FIG. 4 is a top view of a circuit card layer having piezoelectric blocks arranged in a non-regular pattern.

DESCRIPTION OF EMBODIMENTS

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism for altering the mechanical properties of circuit cards and circuit card assemblies. In some embodiments, piezoelectric blocks are embedded in circuit cards to control expansion and contraction as a function of temperature variation. The piezoelectric blocks can have a voltage imposed thereon to control expansion. In some embodiments, the voltage is controlled by a temperature sensor and a thermostat. By controlling thermal expansion of the circuit card, the effective coefficient of thermal expansion of the circuit card can be tailored to more closely match the coefficient of thermal expansion of devices soldered thereto. As a result, solder connections are more reliable.

FIG. 1 shows a cross section of a circuit card assembly. Circuit card assembly 100 includes circuit card 102 and substrate 104. Substrate 104 is shown having integrated circuit 106 attached thereto, and is also shown attached to circuit card 102 at solder connections 108. Substrate 104 can be any type of device capable of being attached to circuit card 102 using solder connections 108. For example, substrate 104 can be a daughtercard, a land grid array package, a large flip-chip mounted semiconductor device, or the like.

Substrate 104 has a coefficient of thermal expansion. The coefficient of thermal expansion describes the thermal expansion behavior of substrate 104 as temperature changes. Circuit card 102 also has a coefficient of thermal expansion, which describes the thermal expansion behavior of circuit card 102. When the coefficient of thermal expansion of substrate 104 and circuit card 102 are substantially equal, substrate 104 and circuit card 102 expand and contract substantially equal amounts as temperature changes. When the coefficients of thermal expansion differ, however, substrate 104 and circuit card 102 do not expand and contract substantially equal amounts as temperature changes. When substrate 104 and circuit card 102 do not expand and contract substantially equal amounts, stress is put on solder joints 108. As the size of substrate 104 increases, or as the difference in coefficients of thermal expansion increases, the stress on solder joints 108 increases, and solder joint failure can result.

Circuit card 102 includes piezoelectric blocks 120 embedded therein. Piezoelectricity is a property of certain classes of crystalline materials. When an electric field is applied to a polarized piezoelectric material, the crystalline structure changes shape, producing dimensional changes in the material in a specific plane, governed by the polarization. Conversely, when mechanical pressure is applied to one of these materials, the crystalline structure produces a voltage proportional to the pressure. The method and apparatus of the present invention allows the transformation from electrical energy to mechanical energy by embedding piezoelectric materials in circuit card 102. When an electrical potential is applied between two electrodes on a piezoelectric block embedded within circuit card 102, the effective coefficient of thermal expansion of circuit card 102 changes. A portion of certain card 102 shown as cross-section 200 is shown in more detail in FIG. 2.

FIG. 2 shows a cross section of a circuit card. Cross-section 200 shows a portion of circuit card 102 (FIG. 1) that includes core material 202 with via 204, and epoxy layers 220 laminated on either side of core material 202. Embedded in epoxy layers 220 are piezoelectric blocks 120. Piezoelectric blocks 120 are embedded in circuit card 102 during manufacture of the circuit card. Piezoelectric blocks 120 can be any type of material having piezoelectric properties. One such example is PZT-5H Bimorph available from Morgan Mitroc, Inc. PZT-5H has high permissivity and coupling, and also has high piezoelectric constant. Piezoelectric blocks 120 are examples of deformable blocks that deform in a controlled manner, causing the circuit card to deform in a controlled manner. Any type of deformable block can be used without departing from the scope of the present invention.

Cross section 200 also shows epoxy layers 222 laminated on either side of epoxy layers 220. Metal traces 208 and 210 are located between two epoxy layers and are coupled to one of piezoelectric blocks 120. Metal traces 208 and 210 supply voltage to electrodes on piezoelectric blocks 120. Metal traces that supply voltage to piezoelectric blocks can be sandwiched between layers, such as metal traces 208 and 210, or can be on an outermost layer, such as metal traces 224. In addition, piezolectric blocks can be located in any number of epoxy layers. For example, piezoelectric blocks 120 can be in epoxy layers 222 as well as in epoxy layers 220, or can be in epoxy layers 222 alone.

In some embodiments, the voltage on metal traces 208 and 210 is controlled by thermostat 214. Thermostat 214 is shown coupled to temperature sensor 212 and voltage source 218. Temperature sensor 212 can be any type of temperature sensor, one example being a thermocouple. Temperature sensor 212 detects the temperature of the circuit card and supplies a signal to thermostat 214. Thermostat 214 provides a voltage to circuit card 102 on node 216. This voltage is coupled to traces 208 and 210 which supply the voltage to the piezoelectric blocks resulting in controlled tensile or compressive deformation of the blocks.

Thermostat 214 and temperature sensor 212 create a "smart" circuit card assembly by automatically controlling the amplitude of the voltage applied to the piezoelectric material. When the temperature begins to rise, and the circuit card starts expanding (positive or negative) beyond a desired limit, the pre-calibrated thermostat turns on, applying a controlled voltage to piezoelectric blocks 120, resulting in controlled deformation of circuit card 102. Thermostat 214 is an example of a voltage controlling device that controls the voltage supplied to piezoelectric blocks 120. Any type of voltage controlling device can be used without departing from the scope of the present invention.

For simplicity, FIG. 2 shows a single piezoelectric block 120 coupled to metal traces 208 and 210. In some embodiments, every piezoelectric block 120 is coupled to the same metal traces, such as metal traces 208 and 210, so that every piezoelectric block 120 has the same voltage applied thereto. In other embodiments, a subset of piezoelectric blocks 120 are coupled to any given set of metal traces. For example, on a circuit card having a large device that dissipates a large quantity of heat, a separate temperature sensor 212 and thermostat 214 can be dedicated to the large device, and piezoelectric blocks in close proximity to the large device can be controlled by the dedicated temperature sensor and thermostat. Any number of local areas can be defined for a circuit card, and any number of dedicated temperature sensors and thermostats can exist without departing from the scope of the present invention.

Temperature sensor 212 is shown coupled to the circuit card in FIG. 2. In some embodiments, temperature sensor 212 is coupled to an object other than the circuit card, such as substrate 104 or integrated circuit 106 (FIG. 1).

Any number of epoxy layers and metal layers can exist, and any number of the epoxy layers can include piezoelectric blocks 120. Cross section 200 is shown having epoxy layers 220 on either side of core 202, each having piezoelectric blocks 120 embedded therein, and also having epoxy layers 222 on the outside of epoxy layers 220. In some embodiments, multiple epoxy layers on either side of core 202 include piezoelectric blocks embedded therein. For example, some embodiments have piezoelectric blocks 120 embedded in pairs of layers equidistant from the center of the core. Other embodiments only have piezoelectric blocks 120 embedded in a single layer near one surface of the circuit card. These embodiments can be useful when a single area of one side of a circuit card benefits from a change in the coefficient of thermal expansion.

Circuit card 102 (FIG. 1) is manufactured by embedding piezoelectric blocks in epoxy layers prior to laminating layers of circuit card 102 together. For example, a circuit card having the structure shown in FIG. 2 can be manufactured by embedding piezoelectric blocks 120 in epoxy layers 220 prior to applying metal layers to the epoxy. In an alternate embodiment, piezoelectric blocks 120 are embedded in epoxy layers after etching has taken place on metal layers. In these embodiments, piezoelectric blocks 120 and metal traces 208 and 210 can share the same layer.

FIG. 3 is a top view of a circuit card layer having piezoelectric blocks arranged in a regular pattern. Top view 300 shows circuit card 302 having an "x" direction and a "y" direction. Piezoelectric blocks 310 are square and are arranged in a regular pattern such that the distance between blocks in the x direction is substantially the same as in the y direction. When a voltage is applied to piezoelectric blocks 310, expansion occurs substantially equally in both the x and y directions. In some embodiments, the amount of expansion is controlled by the distance between piezoelectric blocks 310. In other embodiments, the amount of expansion is controlled by the size of piezoelectric blocks 310.

The regular pattern of piezoelectric blocks 310 can occur across the entire surface of a circuit card 302, or can occur in some regions and not in others. For example, a local area of circuit card 302 where the mismatch of coefficients of thermal expansion are high can benefit from the pattern shown in FIG. 3.

FIG. 4 is a top view of a circuit card layer having piezoelectric blocks arranged in a non-regular pattern. Top view 400 shows piezoelectric blocks 410 arranged in a random or pseudo-random pattern that results in substantially equal expansion in both x and y dimensions.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A circuit card comprising:
   a plurality of layers;
   a plurality of deformable blocks embedded in at least one of the plurality of layers, wherein the each of the plurality of deformable blocks is configured to exhibit a controlled deformation as a function of a voltage applied thereto;
   a temperature sensor coupled to at least one of the plurality of layers; and
   a thermostat coupled between the temperature sensor and the plurality of deformable blocks to apply the voltage as a function of temperature.

2. The circuit card of claim 1 wherein the plurality of deformable blocks comprises a crystalline material having piezoelectric properties.

3. The circuit card of claim 2 wherein:

the circuit card has a top, a bottom, and a center equidistant from the top and bottom; and the plurality of deformable blocks are arranged on two layers of the plurality of layers, the two layers being substantially equidistant from the center.

4. The circuit card of claim 1 wherein the plurality of deformable blocks are arranged in a regular pattern in one of the plurality of layers.

5. The circuit card of claim 1 wherein the plurality of deformable blocks are arranged in a non-regular pattern in one of the plurality of layers.

6. The circuit card of claim 1 wherein the plurality of layers includes a plurality of epoxy layers and a plurality of metal layers, and wherein the plurality of deformable blocks is embedded in at least one of the plurality of epoxy layers.

7. The circuit card of claim 6 further comprising metal traces on at least one of the plurality of metal layers, the metal traces being coupled to the plurality of deformable blocks such that the voltage can be applied thereto.

8. A circuit card assembly comprising:

a circuit card having a plurality of piezoelectric blocks embedded therein;

at least one integrated circuit coupled to the circuit card at a plurality of points;

a temperature sensor to sense a temperature; and a voltage controlling device to apply a voltage to the plurality of piezoelectric blocks as a function of the temperature.

9. The circuit card assembly of claim 8 wherein the temperature sensor is coupled to sense the temperature of the circuit card.

10. The circuit card assembly of claim 8 wherein the temperature sensor is coupled to sense the temperature of the at least one integrated circuit.

11. A circuit card comprising:

a plurality of layers of material;

a plurality of piezoelectric blocks embedded in at least two of the plurality of layers;

a temperature sensor; and a voltage controlling device electrically coupled between the temperature sensor and the plurality of piezoelectric blocks.

12. The circuit card of claim 11 wherein the temperature sensor is thermally coupled to one of the plurality of layers, and electrically coupled to the voltage controlling device.

13. The circuit card of claim 11 further comprising:

a substrate soldered to one of the plurality of layers; and an integrated circuit attached to the substrate;

wherein the temperature sensor is thermally coupled to the substrate and electrically coupled to the voltage controlling device.

14. The circuit card of claim 11 further comprising:

a substrate soldered to one of the plurality of layers; and an integrated circuit attached to the substrate;

wherein the temperature sensor is thermally coupled to the integrated circuit and electrically coupled to the voltage controlling device.

15. The circuit card of claim 11 wherein the plurality of layers comprises:

a core material having a top side and a bottom side;

a first epoxy layer laminated to the top side, the first epoxy layer having piezoelectric blocks embedded therein; and a second epoxy layer laminated to the bottoms side, the second epoxy layer having piezoelectric blocks embedded therein.

16. The circuit card of claim 11 further comprising:

a first integrated circuit attached to a first area on the circuit card, wherein the temperature sensor is thermally coupled to the circuit card in the first area, and the voltage controlling device is electrically coupled to piezoelectric blocks in the first area;

a second integrated circuit attached to a second area on the circuit card;

a second temperature sensor thermally coupled to the circuit card in the second area; and a second voltage controlling device electrically coupled between the second temperature sensor and piezoelectric blocks in the second area.

17. The circuit card of claim 16 further comprising:

a first substrate soldered to the circuit card in the first area, wherein the first integrated circuit and the temperature sensor are attached to the first substrate; and a second substrate soldered to the circuit card in the second area, wherein the second integrated circuit and the second temperature sensor are attached to the second substrate.

* * * * *